United States Patent
Yoo

(10) Patent No.: US 9,762,175 B2
(45) Date of Patent: Sep. 12, 2017

(54) FAILURE DIAGNOSTIC APPARATUS AND METHOD FOR CURRENT SENSORS OF 3-PHASE BRUSHLESS AC MOTOR

(71) Applicant: HYUNDAI MOBIS CO., LTD., Seoul (KR)

(72) Inventor: Ji Hoon Yoo, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 14/926,842

(22) Filed: Oct. 29, 2015

(65) Prior Publication Data
US 2016/0126883 A1 May 5, 2016

(30) Foreign Application Priority Data
Oct. 29, 2014 (KR) .......................... 10-2014-0148203

(51) Int. Cl.
| | | |
|---|---|---|
| H02H 7/09 | (2006.01) | |
| H02P 29/024 | (2016.01) | |
| H02P 21/00 | (2016.01) | |
| G01R 31/34 | (2006.01) | |
| H02H 7/08 | (2006.01) | |
| H02P 29/02 | (2016.01) | |
| H02P 6/14 | (2016.01) | |
| H02P 6/16 | (2016.01) | |

(52) U.S. Cl.
CPC ........ *H02P 29/0241* (2016.02); *G01R 31/343* (2013.01); *H02P 21/0035* (2013.01); *H02H 7/0833* (2013.01); *H02P 6/14* (2013.01); *H02P 6/16* (2013.01); *H02P 29/02* (2013.01)

(58) Field of Classification Search
CPC .... H02P 6/002; H02P 6/14; H02P 6/16; H02P 29/02; H02H 7/0833
USPC ...................................... 318/400.22
See application file for complete search history.

(56) References Cited

U.S. PATENT DOCUMENTS

| | | | | |
|---|---|---|---|---|
| 2010/0123418 A1* | 5/2010 | Itoh | ..................... | H02P 21/0089 318/400.02 |
| 2014/0091743 A1* | 4/2014 | Suzuki | ................. | H02P 29/027 318/400.22 |
| 2014/0156144 A1* | 6/2014 | Hoshi | .................. | B62D 5/0463 701/41 |

FOREIGN PATENT DOCUMENTS

KR 10-2009-0038199 A 4/2009

* cited by examiner

*Primary Examiner* — Kawing Chan
*Assistant Examiner* — Bradley Brown
(74) *Attorney, Agent, or Firm* — Knobbe Martens Olson & Bear LLP

(57) ABSTRACT

A failure diagnostic apparatus for current sensors of a 3-phase brushless AC (BLAC) motor may include: a 3-phase BLAC motor; current sensors each configured to measure a phase current of the 3-phase BLAC motor; a motor driving unit configured to drive the 3-phase BLAC motor; and a control unit configured to drive the 3-phase BLAC motor through the motor driving unit, periodically calculate a phase current error using the phase current fed back through each of the current sensors, and diagnose that a failure occurred in the current sensor of the corresponding phase, when an error count accumulated during a preset time reaches a preset value, based on the phase current error.

9 Claims, 2 Drawing Sheets

FAILURE DIAGNOSTIC APPARATUS AND METHOD FOR CURRENT SENSORS OF 3-PHASE BRUSHLESS AC MOTOR

CROSS-REFERENCES TO RELATED APPLICATIONS

The present application claims priority to Korean application number 10-2014-0148203, filed on Oct. 29, 2014, which is incorporated by reference in its entirety.

BACKGROUND

The present disclosure relates to a failure diagnostic apparatus and method for current sensors of a 3-phase brushless AC (BLAC) motor.

In general, it is typical to measure three phase currents for operation of a 3-phase BLAC motor. In order to measure the three phase currents, three current sensors may be used.

The related technology is disclosed in Korean Patent Laid-open Publication No. 10-2009-0038199 published on Apr. 20, 2009 and entitled "Motor-driven power steering system".

SUMMARY

Embodiments of the present invention are directed to a failure diagnostic apparatus and method for current sensors of a 3-phase BLAC motor, which is capable of sensing a failure which occurs in one current sensor between two current sensors for measuring phase currents of the 3-phase BLAC motor.

In one embodiment, a failure diagnostic apparatus for current sensors of a 3-phase BLAC motor may include: a 3-phase BLAC motor; current sensors each configured to measure a phase current of the 3-phase BLAC motor; a motor driving unit configured to drive the 3-phase BLAC motor; and a control unit configured to drive the 3-phase BLAC motor through the motor driving unit, periodically calculate a phase current error using the phase current fed back through each of the current sensors, and diagnose that a failure occurred in the current sensor of the corresponding phase, when an error count accumulated during a preset time reaches a preset value, based on the phase current error.

The control unit may detect an angle of a motor rotor, calculate a current sum vector for each of three cases based on the rotor angle, calculate phase current errors at a preset time interval according to the rotor angle detected in each of the cases, accumulates the error count when the calculated phase current errors are equal to or more than a preset value, and diagnose that a failure occurred in the current sensor for detecting the corresponding phase current, when the error count for each phase, accumulated during a preset time, reaches a preset value.

The rotor angle may be detected through an encoder.

The three cases may include a case in which the rotor angle ranges from 330° to 30° or from 150° to 210°, a case in which the rotor angle ranges from 30° to 90° or from 210° to 270°, and a case in which the rotor angle ranges from 90° to 150° or from 270° to 330°.

One of the phase current errors may become zero at any one phase according to the rotor angle in each of the three cases, and the other phase current errors may be detected only at the other two phases.

The control unit may calculate a current which is expected to flow for each phase, and calculate the phase current errors by subtracting currents of the corresponding phase, actually measured through the current sensors, from the calculated current.

In another embodiment, a failure diagnostic method for current sensors of a 3-phase BLAC motor may include: detecting, by a control unit, an angle A of a motor rotor; calculating a current sum vector Im in each of three cases based on the rotor angle; calculating phase current errors Du, Dv, and Dw at a preset time interval according to the rotor angle detected in each of the cases; accumulating an error count when the calculated phase current errors are equal to or more than a preset value, and detecting whether the error count for each phase, accumulated during a preset time, reaches a preset value; and diagnosing that a failure occurred in a current sensor for detecting the corresponding phase current, when the error count for each phase reaches the preset value.

In the calculating of the current sum vector Im and the calculating of the phase current errors Du, Dv, and Dw, when the rotor angle ranges from 330° to 30° or from 150° to 210°, the control unit may calculate the current sum vector Im according to $Im=Iu/\cos A$, and calculate the phase current errors Du, Dv, and Dw according to $Du=0$, $Dv=Im \times \cos(A-(2/3)\pi)-Ivf$, and $Dw=Im \times \cos(A+(2/3)\pi)-Iwf$.

In the calculating of the current sum vector Im and the calculating of the phase current errors Du, Dv, and Dw, when the rotor angle ranges from 30° to 90° or from 210° to 270°, the control unit may calculate the current sum vector Im according to $Im=Iw/\cos(A+(2/3)\pi)$, and calculate the phase current errors Du, Dv, and Dw according to $Du=Im \times \cos A-Iuf$, $Dv=Im \times \cos(A-(2/3)\pi)-Ivf$, and $Dw=0$.

In the calculating of the current sum vector Im and the calculating of the phase current errors Du, Dv, and Dw, when the rotor angle ranges from 90° to 150° or from 270° to 330°, the control unit may calculate the current sum vector Im according to $Im=Iv/\cos(A-(2/3)\pi)$, and calculate the phase current errors Du, Dv, and Dw according to $Du=Im \times \cos A-Iuf$, $Dv=0$, $Dw=Im \times \cos(A+(2/3)\pi)-Iwf$.

One of the phase current errors may become zero at any one phase according to the rotor angles in each of the three cases, and the other phase current errors may be detected only at the other two phases.

The control unit may calculate a current which is expected to flow for each phase, and calculate the phase current errors by subtracting currents of the corresponding phase, actually measured through current sensors, from the calculated current.

DESCRIPTION OF EMBODIMENTS

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

As described above, it is typical to measure three phase currents for operation of a 3-phase brushless AC (BLAC) motor.

In order to measure three phase currents, three current sensors may be required. In order to reduce production costs, however, two current sensors for acquiring two current values may be used, and the other current value may be calculated through Kirchhoff's first law that the sum of three phase currents is zero.

However, there has been no specific method for sensing or detecting a failure which occurs in any one of the two current sensors. Thus, an embodiment of the present invention provides a method for sensing a failure which may occur in any one of the two current sensors.

For reference, an MDPS (Motor Driven Power Steering) system may include a 3-phase motor installed at the bottom of a steering shaft, and drives the motor to operate a power steering when a vehicle is started.

Figure 1:
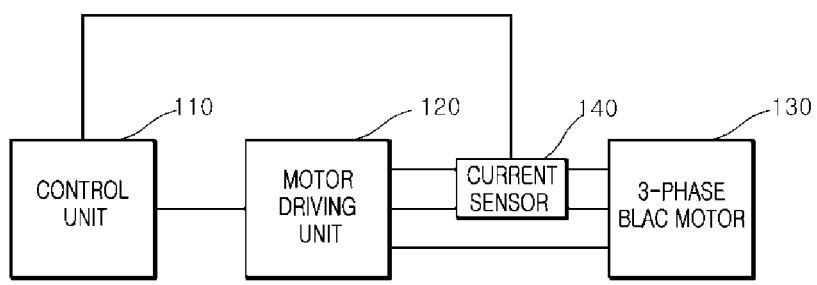
FIG. 1 is a diagram schematically illustrating a failure diagnostic apparatus for current sensors of a 3-phase BLAC motor in accordance with an embodiment of the present invention.

FIG. 1 is a diagram schematically illustrating a failure diagnostic apparatus for current sensors of a 3-phase BLAC motor in accordance with an embodiment of the present invention. As illustrated in FIG. 1, the failure diagnostic apparatus for current sensors of a 3-phase BLAC motor may include a control unit 110, a motor driving unit 120, a 3-phase BLAC motor 130, and two current sensors 140.

The control unit 110 may transmit an ON command to a switching element within the motor driving unit 120, and the current sensors 140 may sense phase currents of the 3-phase BLAC motor 130 and feed back the sensed phase currents to the control unit 110.

The control unit 110 may diagnose a failure in the two current sensors 140 for measuring the respective phase currents of the 3-phase BLAC motor 130, using a method which will be described below.

In order to diagnose a failure in the current sensors, the phase currents Iu, Iv, and Iw of the 3-phase BLAC motor 130 may be theoretically modeled as follows.

Iu=Im cos A
Iv=Im cos(A−2/3 pi)
Iw=Im cos(A+2/3 pi)

Here, A represents the angle of a rotor, and Im represents the magnitude of a current sum vector.

At this time, when supposing that the current sensors 140 sense currents for two phases u and v among three phases u, v, and w, the control unit 110 may recognize the two phase currents Iu and Iv measured through the current sensors 140, and estimate the other phase current Iw according to Kirchhoff's law (Iw=−(Iu+Iv)).

Hereafter, suppose that Iuf, Ivf, and Iwf represent actually sensed currents (actually measured currents).

Furthermore, based on the magnitude of the current sum vector Im which is calculated according to the above-described information (that is, the actually sensed currents Iuf, Ivf, and Iwf) and the angle A of the rotor, the control unit 110 may diagnose a phase current error in the following three cases Case1 to Case3, that is, three cases depending on the angle of the rotor (refer to FIG. 2).

Figure 2:
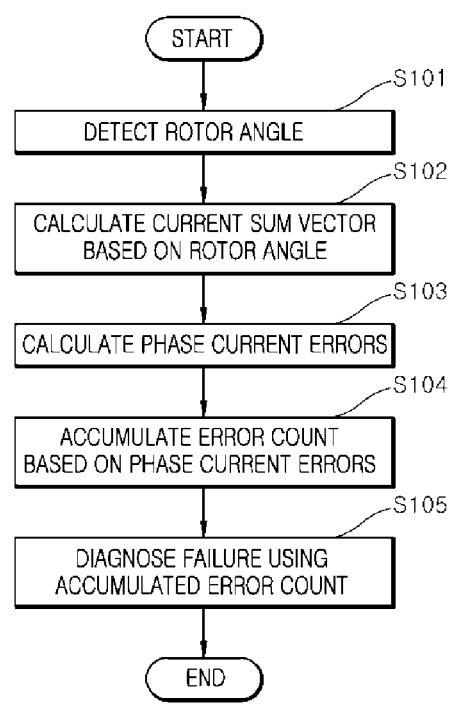
FIG. 2 is a flowchart for describing a failure diagnostic method for current sensors of a 3-phase BLAC motor in accordance with an embodiment of the present invention.

FIG. 2 is a flowchart for describing a failure diagnostic method for current sensors of a 3-phase BLAC motor in accordance with an embodiment of the present invention.

As illustrated in FIG. 2, the control unit 110 may detect the angle of the rotor at step S101.

The rotor angle A may be detected through an encoder.

The rotor angle A may be divided into the following three cases Case1 to Case3.

Case1 represents a case in which the rotor angle A ranges from 330° to 30° or from 150° to 210°, Case2 represents a case in which the rotor angle A ranges from 30° to 90° or from 210° to 270°, and Case3 represents a case in which the rotor angle A ranges from 90° to 150° or from 270° to 330°.

When the rotor angle A is detected as described above, the control unit 110 may calculate a current sum vector Im based on the rotor angle at step S102.

Furthermore, according to the detected rotor angle, the control unit 110 may calculate phase current errors Du, Dv, and Dw at a preset time interval (for example, 1 ms), at step S103.

At this time, one of the phase current errors may be detected as zero at any one phase according the rotor angle (that is, according to three cases), and the other phase current errors may be detected only at the other two phases.

The phase current errors Du, Dv, and Dw (that is, current sensing errors) may be calculated by subtracting the actually measured currents Iuf, Ivf, and Iwf from a current which is expected to flow (that is, a current calculated through the current sum vector Im).

After the phase current errors are calculated as described above, the control unit 110 may accumulate an error count when the calculated phase current errors are equal to or more than a preset value (for example, 10 A), at step S104. The error count may be increased whenever an error is determined to occur.

Hereafter, the method for calculating phase current errors for the above-described three cases will be described.

(Case 1)

When the rotor angle A ranges from 330° to 30° or from 150° to 210°,

Im=Iu/cos A,
Du=0,
Dv=Im×cos(A−(2/3)π)−Ivf, and
Dw=Im×cos(A+(2/3)π)−Iwf.

Thus, when the phase current error Dv or Dw is equal to or more than the preset value (for example, 10 A), the control unit 110 may increase the error count.

(Case 2)

When the rotor angle A ranges from 30° to 90° or from 210° to 270°,

Im=Iw/cos(A+(2/3)π)
Du=Im×cos A−Iuf,
Dv=Im×cos(A−(2/3)π)−Ivf, and
Dw=0.

Thus, when the phase current error Du or Dv is equal to or more than the preset value (for example, 10 A), the control unit 110 may increase the error count.

(Case 3)

When the rotor angle A ranges from 90° to 150° or from 270° to 330°,

Im=Iv/cos(A−(2/3)π),
Du=Im×cos A−Iuf,
Du=0, and
Dw=Im×cos(A+(2/3)π)−Iwf.

Thus, when the phase current error Du or Dw is equal to or more than the preset value (for example, 10 A), the control unit 110 may increase the error count.

When the calculated phase current error is less than the preset value, the control unit 110 may reduce or reset the error count.

Furthermore, when the accumulated error count for each phase reaches a preset value (for example, 20) during a preset time (for example, 20 seconds), the control unit 110 may diagnose that the current sensor 140 for detecting the corresponding phase current has a failure, at step S105.

In accordance with the present embodiment, even when a failure occurs in one current between the two current sensors for measuring phase currents of the 3-phase BLAC motor, the failure diagnostic apparatus and method may sense the failure and diagnose the failure of the current sensor, thereby improving the stability of the MDPS system.

Although embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A failure diagnostic apparatus for a 3-phase motor comprising current sensors each configured to measure a phase current of the 3-phase motor, the apparatus comprising:
 a control unit configured periodically calculate a phase current error using the phase current fed back through each of the current sensors, and diagnose that a failure occurred in one of the current sensors, when an error count accumulated during a preset time reaches a preset value, based on the phase current error,
 wherein the control unit is further configured to:
  obtain an angle (A) of a motor rotor,
  calculate a current sum vector (Im) in each of three cases of the rotor angle (A), wherein the three cases comprise a case in which the rotor angle (A) ranges from 330° to 30° or from 150° to 210°, a case in which the rotor angle (A) ranges from 30° to 90° or from 210° to 270°, and a case in which the rotor angle A ranges from 90° to 150° or from 270° to 330°,
  calculate phase current errors (Du, Dv and Dw) at a preset time interval according to the rotor angle detected in each of the three cases,
  accumulate an error count when the calculated phase current errors are equal to or more than a preset value,
  detect whether the error count for each phase, accumulated during a preset time, reaches an another preset value, and
  diagnose a failure occurred in a current sensor, when the error count reaches the preset value,
 wherein when the rotor angle ranges from 330° to 30° or from 150° to 210°, the control unit is further configured to calculate the current sum vector Im according to Im=Iu/cos(A), and is configured to calculate the phase current errors (Du, Dv and Dw) according to Du=0, Dv=Im×cos(A−(2/3)π)−Ivf, and Dw=Im×cos(A+(2/3)π)−Iwf, where A is a rotor angle, Iu is a phase current of the 3-phase motor, and Ivf and Iwf are actually sensed currents.

2. The failure diagnostic apparatus of claim 1, wherein the rotor angle is detected through an encoder.

3. The failure diagnostic apparatus of claim 1, wherein one of the phase current errors is detected as zero at any one phase according to the rotor angle in each of the three cases, and the other phase current errors are detected only at the other two phases.

4. The failure diagnostic apparatus of claim 1, wherein the control unit is further configured to calculate a current which is expected to flow for each phase, and to calculate the phase current errors by subtracting currents measured through the current sensors, from the calculated current.

5. A failure diagnostic method for a 3-phase motor comprising current sensors each configured to measure a phase current of the 3-phase motor, the method comprising:
 obtaining, by a control unit of the 3-phase motor, an angle (A) of a motor rotor;
 calculating, by the control unit, a current sum vector (Im) in each of three cases of the rotor angle (A), wherein the three cases comprise a case in which the rotor angle (A) ranges from 330° to 30° or from 150° to 210°, a case in which the rotor angle (A) ranges from 30° to 90° or from 210° to 270°, and a case in which the rotor angle (A) ranges from 90° to 150° or from 270° to 330°;
 calculating, by the control unit, phase current errors (Di, Dv, and Dw) at a preset time interval according to the rotor angle detected in each of the cases;
 accumulating, by the control unit, an error count when the calculated phase current errors are equal to or more than a preset value, and detecting whether the error count for each phase, accumulated during a preset time, reaches an another preset value; and
 diagnosing, by the control unit, that a failure occurred in a current sensor, when the error count reaches the preset value,
 wherein in the calculating of the current sum vector Im and the calculating of the phase current errors Du, Dv, and Dw, when the rotor angle ranges from 330° to 30° or from 150° to 210°, the control unit calculates the current sum vector (Im) according to Im=Iu/cos(A), and calculates the phase current errors (Du, Dv, and Dw) according to Du=0, Dv=Im×cos(A−(2/3)π)−Ivf, and Dw=Im×cos(A+(2/3)π)−Iwf, where A is a rotor angle, Iu is a phase current of the 3-phase motor, and Ivf and Iwf are actually sensed currents.

6. The method of claim 5, wherein in the calculating of the current sum vector (Im) and the calculating of the phase current errors (Du, Dv, and Dw),
 when the rotor angle ranges from 30° to 90° or from 210° to 270°, the control unit calculates the current sum vector (Im) according to Im=Iw/cos(A+(2/3)π), and calculates the phase current errors Du, Dv, and Dw according to Du=Im×cos(A)−Iuf, Dv=Im×cos(A−(2/3)π)−Ivf, and Dw=0, where A is a rotor angle, Iw is a phase current of the 3-phase motor, and Iuf and Ivf are actually sensed currents.

7. The method of claim 5, wherein in the calculating of the current sum vector (Im) and the calculating of the phase current errors (Du, Dv, and Dw),
 when the rotor angle ranges from 90° to 150° or from 270° to 330°, the control unit calculates the current sum vector Im according to Im=Iv/cos(A−(2/3)π), and calculates the phase current errors Du, Dv, and Dw according to Du=Im×cos(A)−Iuf, Dv=0, Dw=Im×cos(A+(2/3)π)−Iwf, where A is a rotor angle, Iv is a phase current of the 3-phase motor, and Iuf and Iwf are actually sensed currents.

8. The method of claim 5, wherein one of the phase current errors is detected as zero at any one phase according to the rotor angles in each of the three cases, and the other phase current errors are detected only at the other two phases.

9. The method of claim 5, wherein the control unit calculates a current which is expected to flow for each phase, and calculates the phase current errors by subtracting currents measured through current sensors, from the calculated current.

* * * * *